(12) United States Patent
Shin et al.

(10) Patent No.: US 6,742,281 B2
(45) Date of Patent: Jun. 1, 2004

(54) APPARATUS FOR DRYING SEMICONDUCTOR WAFER USING VAPOR DRY METHOD

(75) Inventors: Myung-Hwan Shin, Kyungki-do (KR); Man-Young Lee, Kyungki-do (KR); Kyung-Seuk Hwang, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/382,350

(22) Filed: Mar. 4, 2003

(65) Prior Publication Data

US 2004/0045185 A1 Mar. 11, 2004

(30) Foreign Application Priority Data

Sep. 6, 2002 (KR) ................. 10-2002-0053925

(51) Int. Cl.[7] .................................................. F26B 3/08
(52) U.S. Cl. ............................... 34/366; 34/467; 34/95; 34/443; 34/236
(58) Field of Search .................... 34/366, 471, 470, 34/467, 468, 469, 407, 78, 202, 107, 201, 209, 236, 95, 443; 134/95.2

(56) References Cited

U.S. PATENT DOCUMENTS 5,299,584 A * 4/1994 Miyazaki et al. ......... 134/56 R
6,412,501 B1 * 7/2002 Onoda et al. ............. 134/95.2

* cited by examiner

Primary Examiner—Henry Bennett
Assistant Examiner—Camtu Nguyen
(74) Attorney, Agent, or Firm—Marger Johnson & McCollom, P.C.

(57) ABSTRACT

A semiconductor wafer drying apparatus is provided. In one embodiment, this apparatus includes a bath which can contain much deionized water so that semiconductor wafers soak in the deionized water; a chamber providing a space where vapor flows over the bath; a vapor supply line supplying vapor to the internal space of the chamber; an exhaust line discharging vapor contained in the chamber; a deionized water exhaust line discharging deionized water in the bath; a semiconductor wafer holder supporting the semiconductor wafer in the bath; and pitch guides placed at left and right sides of the semiconductor wafer, movable to a first position and a second position in a vertical direction, wherein the pitch guides are separated from the semiconductor wafer at the first position and contact the semiconductor wafer at the second position thus preventing the movement of the semiconductor wafer.

19 Claims, 19 Drawing Sheets

APPARATUS FOR DRYING SEMICONDUCTOR WAFER USING VAPOR DRY METHOD

BACKGROUND OF THE INVENTION

This application claims the priority of Korean Patent Application No. 2002-53925, filed Sep. 6, 2002 in the Korean Intellectual Property Office (KIPO), which is incorporated herein in its entirety by reference.

1. Field of the Invention

The present invention relates to an apparatus for drying a semiconductor wafer, and more particularly, to an apparatus for drying a semiconductor wafer, using a cleansing vapor and deionized water, which is designed to prevent adhesion of adjacent semiconductor wafers to each other.

2. Description of the Related Art

In general, impurities formed on a semiconductor wafer during manufacture of a semiconductor chip are cleaned in a cleaning process. The cleaning process may include (a) treatment of the semiconductor wafer with a chemical solution, (b) rinsing the chemically treated semiconductor wafer with deionized water (hereinafter, 'DIW'), and (c) drying the rinsed semiconductor wafer. Typically, a spin-drying method was used to dry the rinsed semiconductor wafer. However, the higher the integration of a semiconductor device, the more complicated is the surface structure of a semiconductor wafer. Accordingly, a solvent vapor drying method is employed in which the DIW is replaced by a solvent vapor of an organic material, such as an isopropyl-alcohol vapor (hereinafter, 'IPA'), in the spin drying method.

FIG. 1 illustrates a method of drying a semiconductor wafer using a conventional semiconductor wafer drying apparatus that utilizes a solvent vapor drying method. Referring to FIG. 1, this semiconductor wafer solvent drying apparatus includes a chamber 110 that performs a drying process on a semiconductor wafer 100. The chamber 110 is connected to a solvent vapor storage container 130, in which a solvent solution 132 is stored, via supply line 150. The solvent vapor storage container 130 is also connected to a nitrogen gas supply pipe 134 through which a nitrogen ($N_2$) gas is supplied from an outside source (not shown).

A wafer holder 111, on which the semiconductor 100 is positioned in the chamber 110. The wafer holder 111 is movable in the vertical direction within the chamber 110, and in turn, the semiconductor wafer 100 also can be moved in the vertical direction within the chamber 110. A waste water drain line 113 is placed below the wafer holder 111 to drain waste water remaining after evaporation of the solvent solution 132. A heater 115 is attached to the bottom of the chamber 110. The heater 115 generates heat in the chamber 110 so as to evaporate a solvent solution 132' supplied in the chamber 110. Exhaust lines 117 are installed at an intermediate position B and at an upper position C of the chamber 110, so as to discharge vapor of evaporated solvent solution to the outside of the chamber 110. In addition, a filter 119 is attached to the top of the chamber 110 to filter air and the like supplied from outside the chamber 110.

A process of drying a semiconductor wafer using such a semiconductor wafer drying apparatus will now be described with reference to FIG. 1. First, the semiconductor wafer 100 cleaned with DIW is placed in the chamber 110 and is held in place by the wafer holder 111. The semiconductor wafer 100 is originally placed at a position A. When the semiconductor wafer 100 is loaded onto the wafer holder 111 in the chamber 110, the solvent solution 132 in the storage container 130 is supplied to the inside of the chamber 110 via the supply line 150.

The solvent solution 132' supplied in the chamber 110 is boiled using heat generated by the heater 115. The waste water remaining after the evaporation of the solvent solution 132' is discharged via the waste water drain line 113. Solvent vapor 132" takes the place of the DIW associated with the surface of the semiconductor wafer 100. Next, after a certain amount of time has passed, the wafer holder 111 is moved upwardly so that the semiconductor wafer 100 is positioned at the position B in the chamber 110. Solvent vapor associated with the semiconductor wafer 100 at the position B is continuously discharged via the exhaust line 117 at the position B. Next, after a predetermined amount of time, the wafer holder 111 is moved to the position C in the chamber 110 and solvent vapor associated with the semiconductor wafer 100 is completely discharged via the exhaust line 117 at the position C. After the removal of the solvent vapor associated with the semiconductor wafer 100, the semiconductor wafer 100 is removed from the chamber 100.

The semiconductor wafer drying apparatus of FIG. 1 has its disadvantages. For example, it is difficult to precisely control the amount of solventsolution to be evaporated. If the solvent solution is evaporated under extreme conditions in the chamber 100, a great amount of carbon (C) is detected from the dried surface of the semiconductor wafer. To solve this problem, the surface of the semiconductor wafer is dried by flooding the inside of chamber 100 with DIW, and then supplying nitrogen gas and solvent vapor to the chamber in an upwardly direction of the semiconductor wafer, while discharging the DIW downwardly from the semiconductor wafer.

As the size of a semiconductor wafer increases, a drying process is performed on the semiconductor wafers using a half pitching method. The half pitching method comprises stacking the semiconductor wafers for batch processing of more than 50 sheets of semiconductor wafers of diameters of 200 mm or more. In this case, however, a reduction in the distance between semiconductor wafersis inevitable. Thus, an adverse result is produced, namely, adhesion of adjacent semiconductor wafers. The adhesion of adjacent semiconductor wafers prevents complete removal of DIW adhering to surfaces to semiconductor wafers. Water marks on the semiconductor wafers, due to incomplete removal of the DIW, causes malfunction of the semiconductor devices.

SUMMARY OF THE INVENTION

The present invention provides an apparatus and method for semiconductor wafer vapor drying wherein adhesion of adjacent semiconductor wafers is prevented during the wafer drying process.

According to an embodiment of the present invention, there is provided a semiconductor wafer drying apparatus including a bath which can contain much deionized water so that semiconductor wafers soak in the deionized water; a chamber providing a space where vapor flows over the bath; a vapor supply line supplying vapor to the internal space of the chamber; an exhaust line discharging vapor contained in the chamber to the outside of the chamber; a deionized water exhaust line discharging deionized water in the bath to the outside of the bath; a semiconductor wafer holder supporting the semiconductor wafer in the bath; and pitch guides placed at left and right sides of the semiconductor wafer, movable to a first position and a second position in a vertical direction, wherein the pitch guides are separated from the semiconductor wafer at the first position and contact the semiconductor wafer at the second position thus preventing the movement of the semiconductor wafer.

Preferably, the pitch guides can be moved to a third position where the semiconductor wafer is positioned at a distance from the semiconductor wafer holder.

Preferably, the pitch guides are connected to a motor and provided with a driving force for the vertical movement from the motor. Alternatively, the pitch guides may be connected to a piston and provided with a driving force for the vertical movement from the piston. If necessary, the vertical movements of the pitch guides may be carried out by a driving force due to lifting power of the deionized water.

Preferably a nitrogen gas and isopropyl alcohol (IPA) vapor are supplied into the chamber via the vapor supply line.

Preferably, the pitch guides are moved to the second position when an upper portion of the semiconductor wafer is exposed from the surface of the deionized water.

According to another embodiment of the present invention, there is provided a semiconductor wafer drying apparatus including a bath which can contain much deionized water so that semiconductor wafers soak in the deionized water; a chamber providing a space where vapor flows over the bath; a vapor supply line supplying vapor to the internal space of the chamber; an exhaust line discharging vapor contained in the chamber to the outside of the chamber; a deionized water exhaust line discharging deionized water in the bath to the outside of the bath; a semiconductor wafer holder supporting the semiconductor wafer in the bath; and pitch guides placed at left and right sides of the semiconductor wafer, movable to a first position and a second position in a vertical direction, wherein the pitch guides are separated from the semiconductor wafer at the first position and contact the semiconductor wafer at the second position thus preventing the movement of the semiconductor wafer.

Preferably, the pitch guides are connected to a motor and provided with a driving force for the horizontal movement from the motor. Alternatively, the pitch guides may be connected to a piston and provided with a driving force for the horizontal movement from the piston.

Preferably, nitrogen gas and IPA vapor are supplied into the chamber via the vapor supply line.

Preferably, the pitch guides are moved to the second position when an upper portion of the semiconductor wafer is exposed from the surface of the deionized water.

BRIEF DESCRIPTION OF THE DRAWINGS

The above aspect and advantages of the present invention will become more apparent by describing in detail a preferred embodiment thereof with reference to the attached drawing in which.

DETAILED DESCRIPTION OF THE INVENTION

Figure 1:
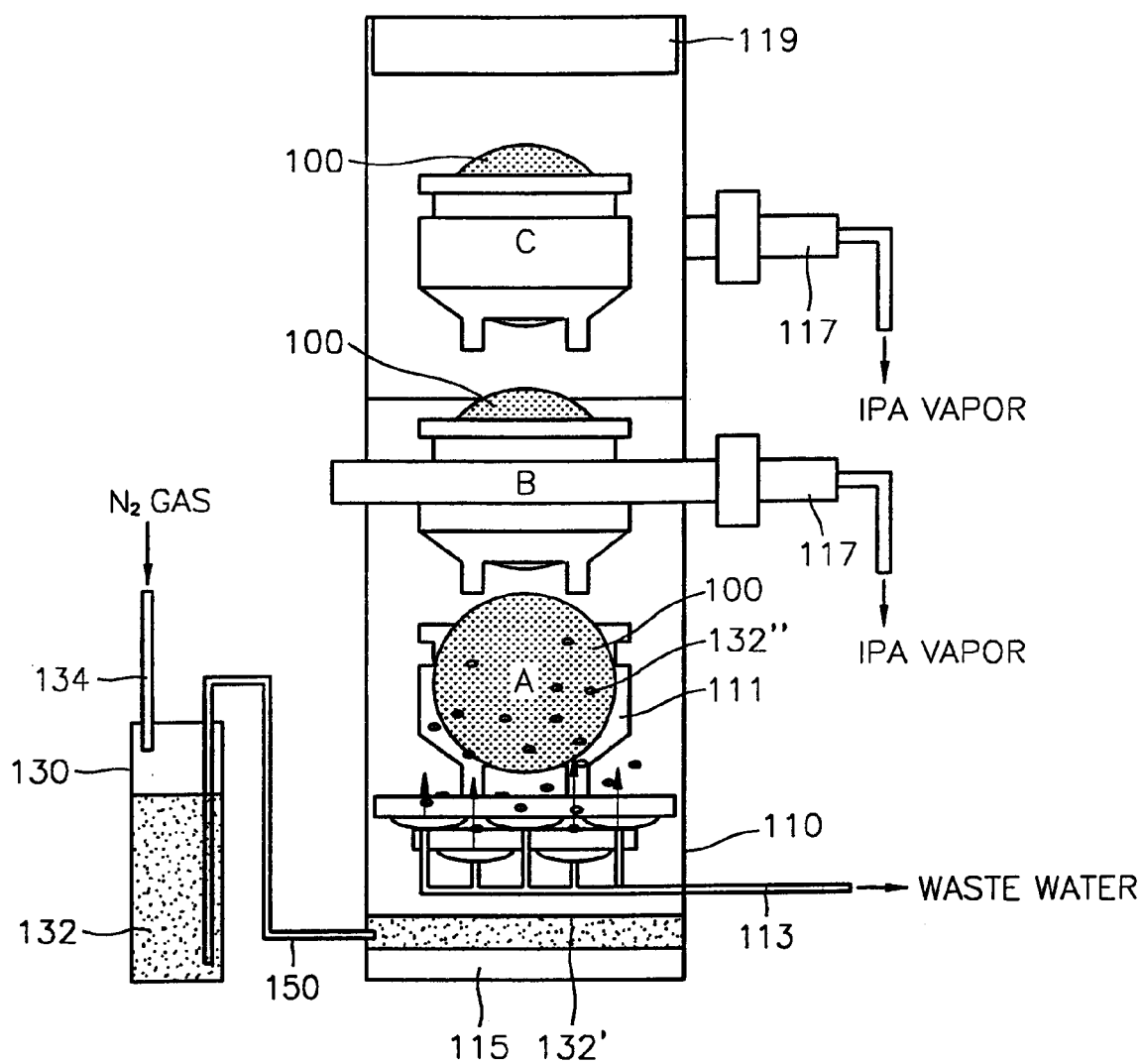
FIG. 1 is a diagram illustrating a conventional semiconductor wafer drying apparatus and a method of drying a semiconductor wafer using the apparatus.
Figure 2:
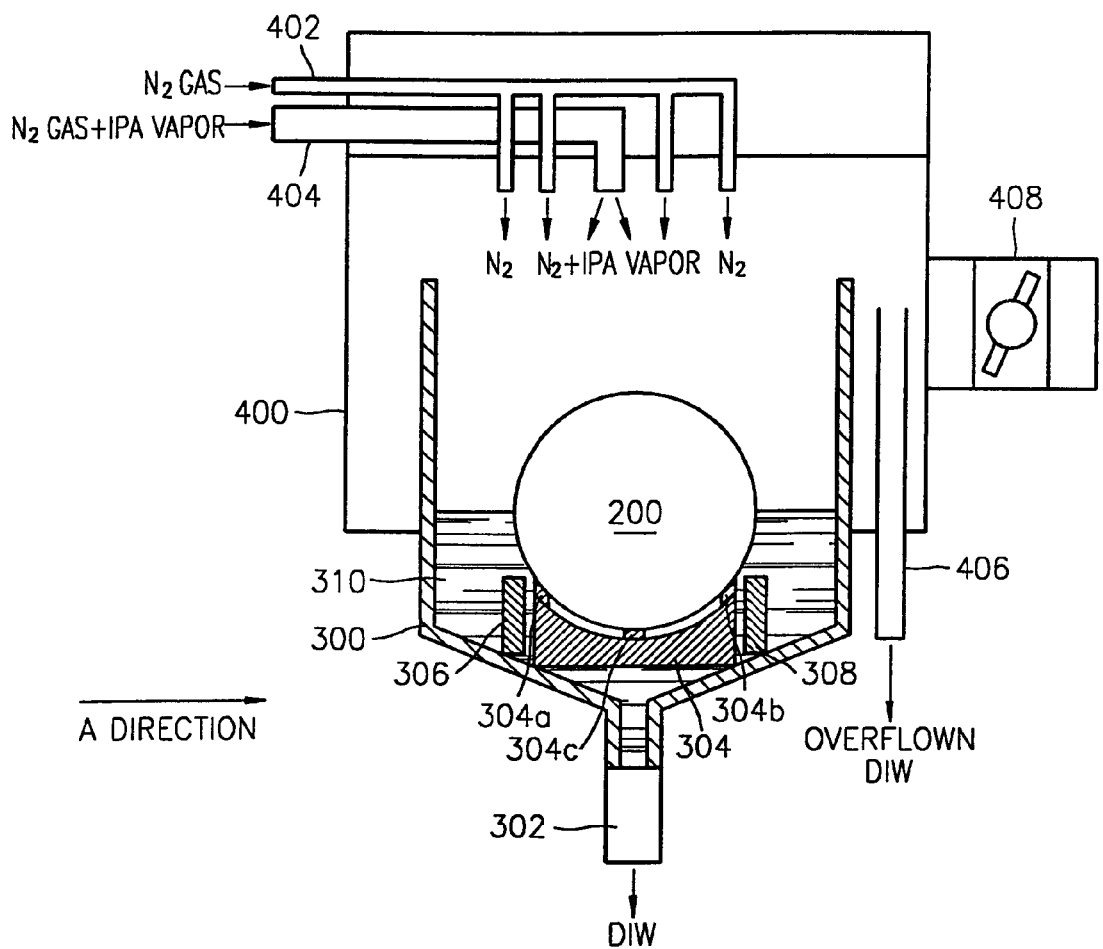
FIG. 2 is a diagram of a semiconductor wafer drying apparatus according to the present invention.

FIG. 2 is a diagram of a semiconductor wafer drying apparatus (hereinafter"apparatus") according to an embodiment of the present invention. The apparatus of FIG. 2 includes a bath 300 being provided so that a semiconductor wafer 200 can soak in deionized water (DIW) 310, and a chamber 400 being arranged to surround the bath 300 and overlap an upper part of the bath 300. A DIW outlet 302 is attached to a lower portion of the bath 300 so as to discharge the DIW 310 . Also, in the lower portion of bath 300, a semiconductor wafer holder 304 is placed. This is where the semiconductor wafer 200 is positioned and held in position during processing. Guides 304a, 304b, and 304c are formed at a surface of the semiconductor wafer holder 304 that contacts the semiconductor wafer 200. For instance, the guides 304a and 304b have V-shaped grooves into which a lower side of the semiconductor wafer 200 is to be inserted. Also, guide 304c has a Y-shaped groove into which the bottom of the semiconductor wafer 200 can be inserted. Pitch guides 306 and 308 are positioned at both sides of the semiconductor wafer 200. The pitch guides 306 and 308 are aligned at opposed edges of the semiconductor wafer 200. The pitch guides 306 and 308 makes a uniformly position the respective semiconductor wafers 200. The functions of the pitch guides 306 and 308 will be later described.

The chamber 400 has a nitrogen gas supply line 402 connected thereto for supplying a nitrogen gas in an airtight space in the chamber 400,. A nitrogen gas and isopropyl alcohol (IPA) vapor supply line 404 for supplying the nitrogen gas and IPA vapor in the airtight space, and a DIW exhaust line 406 for discharging overflown DIW is provided. Also, a nitrogen gas and IPA outlet 408 is attached to a sidewall of the chamber 400 in order to discharge the nitrogen gas and IPA vapor contained in the chamber 400.

Figure 3:
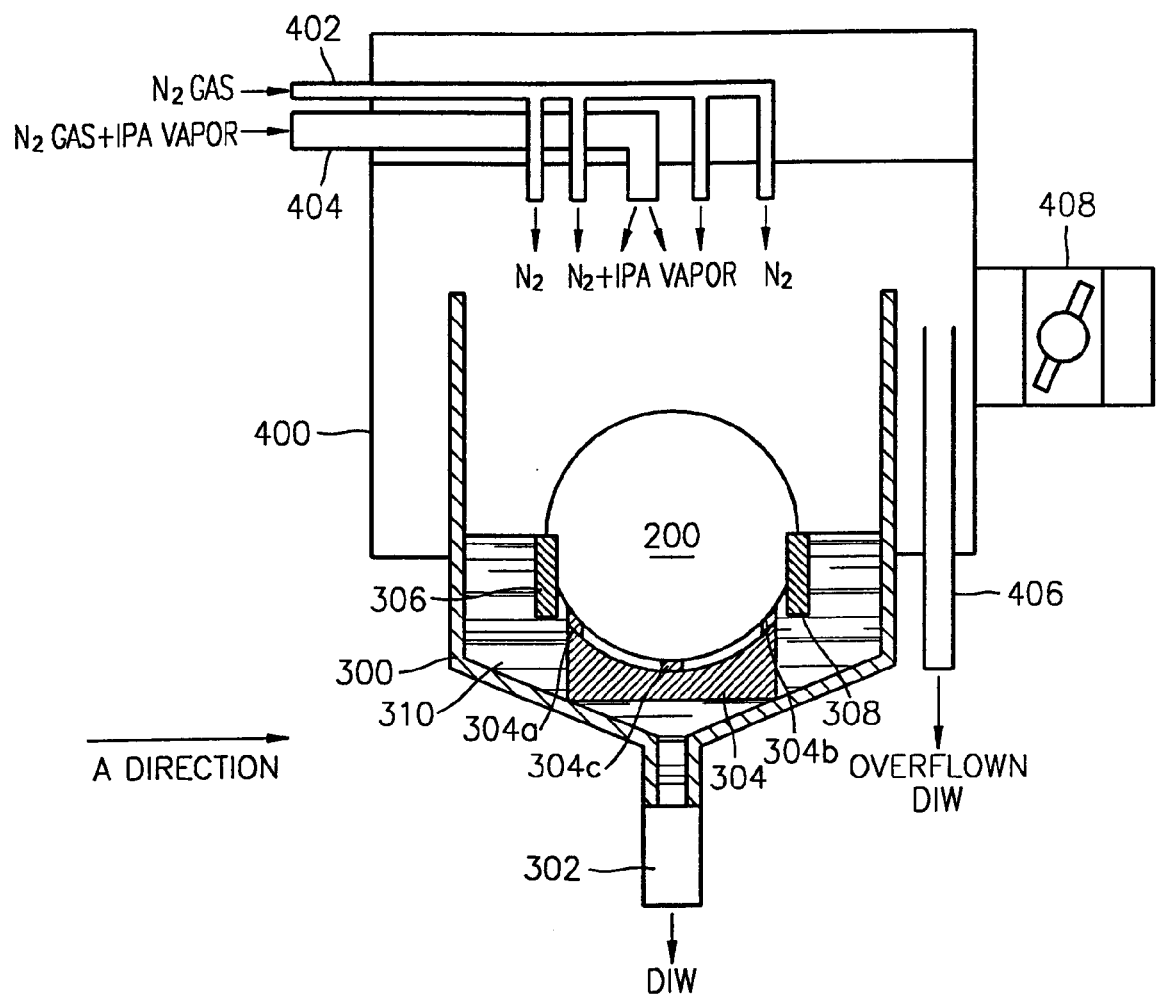
FIG. 3 is a diagram of the semiconductor wafer drying apparatus of FIG. 2 in which a first pitch guide and a second pitch guide are moved to a certain position to support sides of a semiconductor wafer.

FIG. 3 is a diagram of the semiconductor wafer drying apparatus of FIG. 2 where the pitch guides 306 and 308 are moved to an alternative position for supporting the sides of the semiconductor wafer 200. The same reference numerals as those in FIG. 2 represent the same elements and thus their detailed description will be omitted.

Referring again to FIG. 3, the pitch guides 306 and 308 are elevated to a predetermined position from the original position illustrated in FIG. 2 with respect to the support sides of the semiconductor wafer 200. The pitch guides 306 and 308 maintain the semiconductor wafer 200 in a fixed position so that it is not to be adhered with adjacent semiconductor wafers during a drying process of drying semiconductor wafers. The pitch guides 306 and 308 can be elevated to a higher position and holding the semiconductor wafer 200 in a fixed position.

Figure 4A:
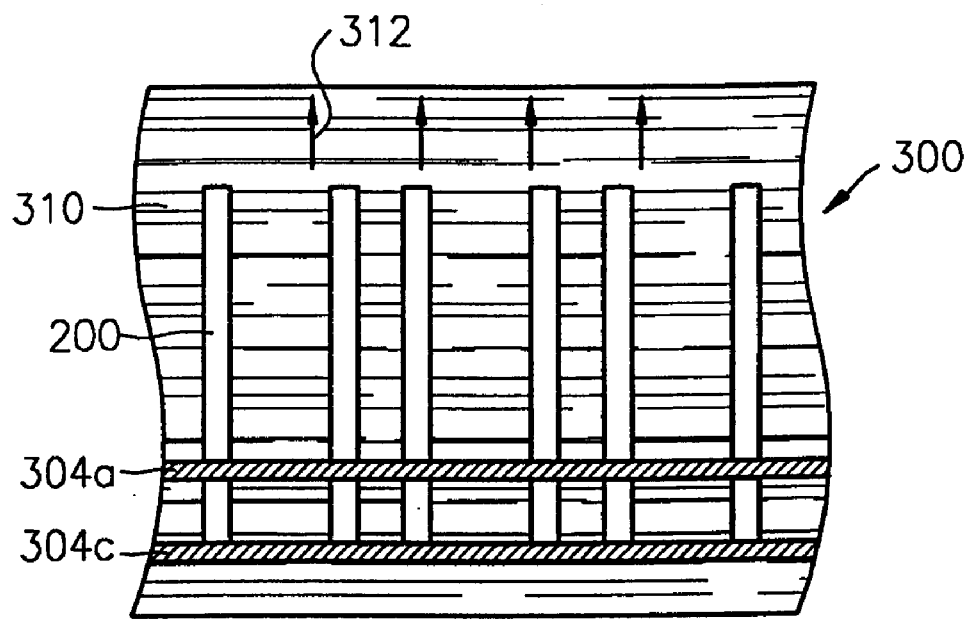
FIGS. 4A through 4C are cross-sectional views illustrating problems occurring if the first and second pitch guides shown in FIGS. 2 and 3 are not included in the semiconductor wafer drying apparatus of FIG. 2.
Figure 4B:
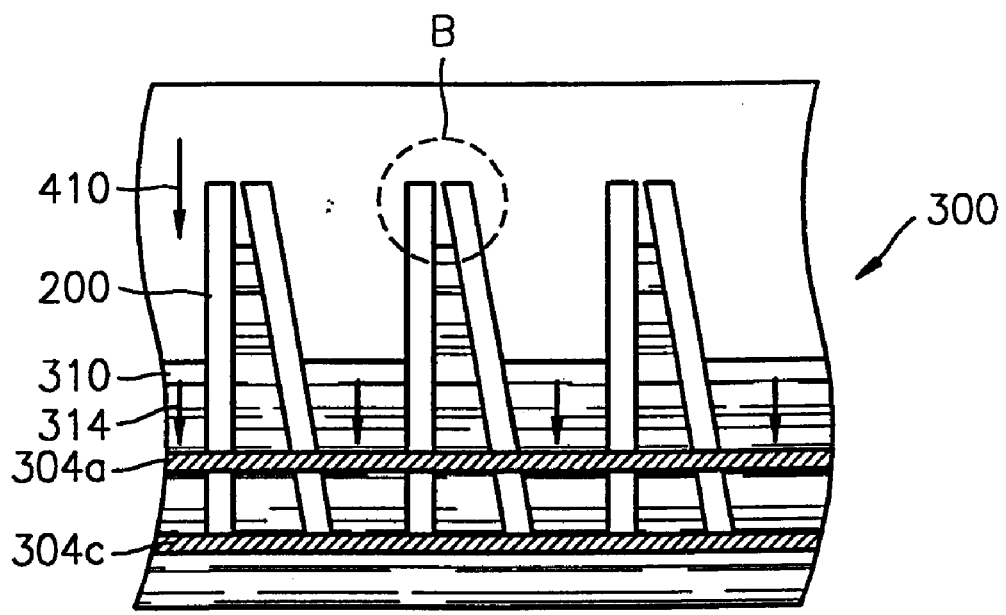
Figure 4C:
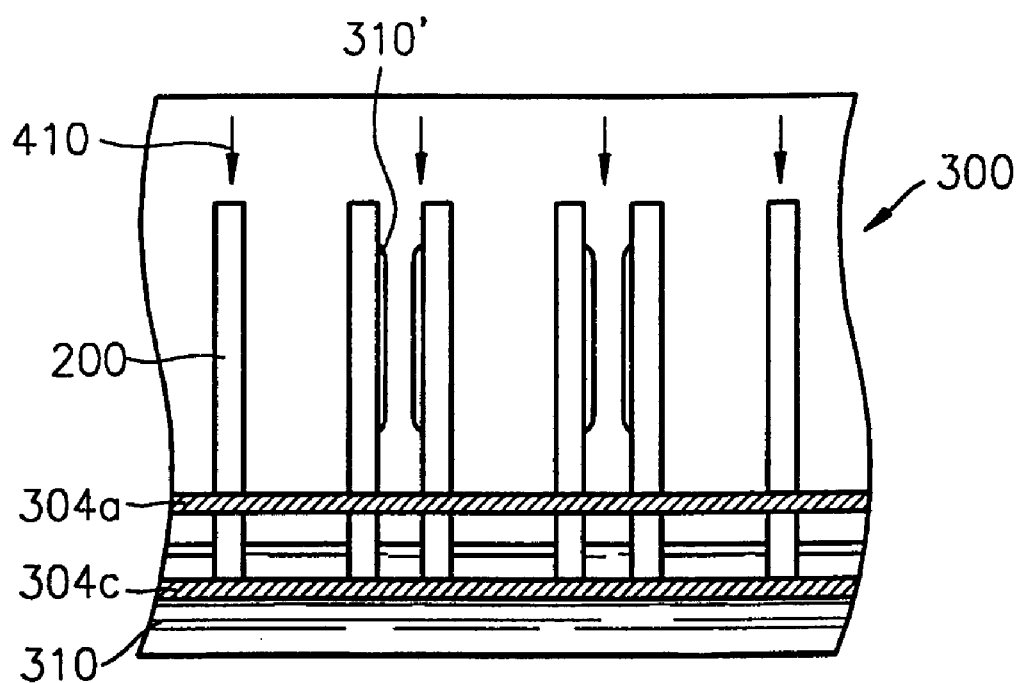

FIGS. 4A through 4C are cross-sectional views illustrating problems which can occur when the pitch guides 306 and 308 shown in FIGS. 2 and 3 are not included in a semiconductor wafer drying apparatus. In detail, FIGS. 4A through 4C are cross-sectional views of the bath 300 of FIG. 2, viewed in the direction of arrow A. First, FIG. 4A shows a process where the DIW 310 is overflown while semiconductor wafers 200 are loaded in the bath 300. FIG. 4B shows a process where adjacent semiconductor wafers 200 are adhered to each other during the drainage of the DIW 310. FIG. 4C shows a process where the adhered semiconductor wafers 200 are separated from each other after the drainage of the DIW 310.

More specifically, referring to FIG. 4A, lower sides and bottom of the semiconductor wafers 200 are supported by the guide 304a and guide 304c of a semiconductor wafer holder (not shown), respectively. When the DIW 310 overflows in the upper direction as indicated with an arrow 312, the semiconductor wafers 200 are completely dipped into the DIW 310 and a surface thereof is cleaned by the DIW 310.

Next, referring to FIG. 4B, a nitrogen gas and IPA vapor are supplied toward the semiconductor wafers 200 in the direction of an arrow 410 while the DIW 310 is gradually drained via the DIW outlet 301 of FIGS. 2 and 3. In this case, the DIW 310 is gradually drained downward in the direction of an arrow 314 and as a result, an upper part of the semiconductor wafers 200 begins to be exposed. The DIW 310 remaining on the semiconductor wafers 200 is then contacted by the incoming IPA vapor. During the IPA vapor treatment step, adjacent semiconductor wafers 200 are, however, adhered to each other due to surface tension between the adjacent semiconductor wafers 200, in the area marked B. Adhesion of adjacent semiconductor wafers 200 causes the DIW 310 remain on the surface of the semiconductor wafers 200.

Next, referring to FIG. 4C, as the DIW 310 is almost completely drained, the semiconductor wafers 200 are exposed . Then, adjacent semiconductor wafers 200 which are adhered to each other are separated by the effect of the respective weight of the semiconductor wafers 200 and the weight of the DIW 310 remaining on the semiconductor wafers 200. After the separation, the surfaces of the semiconductor wafers 200 are still stained with the DIW 310. The DIW 310 runs down along the surfaces of the semiconductor wafers 200 and becomes water marks 310'.

FIGS. 5A through 5F are diagrams illustrating a method of drying the semiconductor wafer 200 using a semiconductor wafer drying apparatus according to an embodiment of the present invention.

Figure 5A:
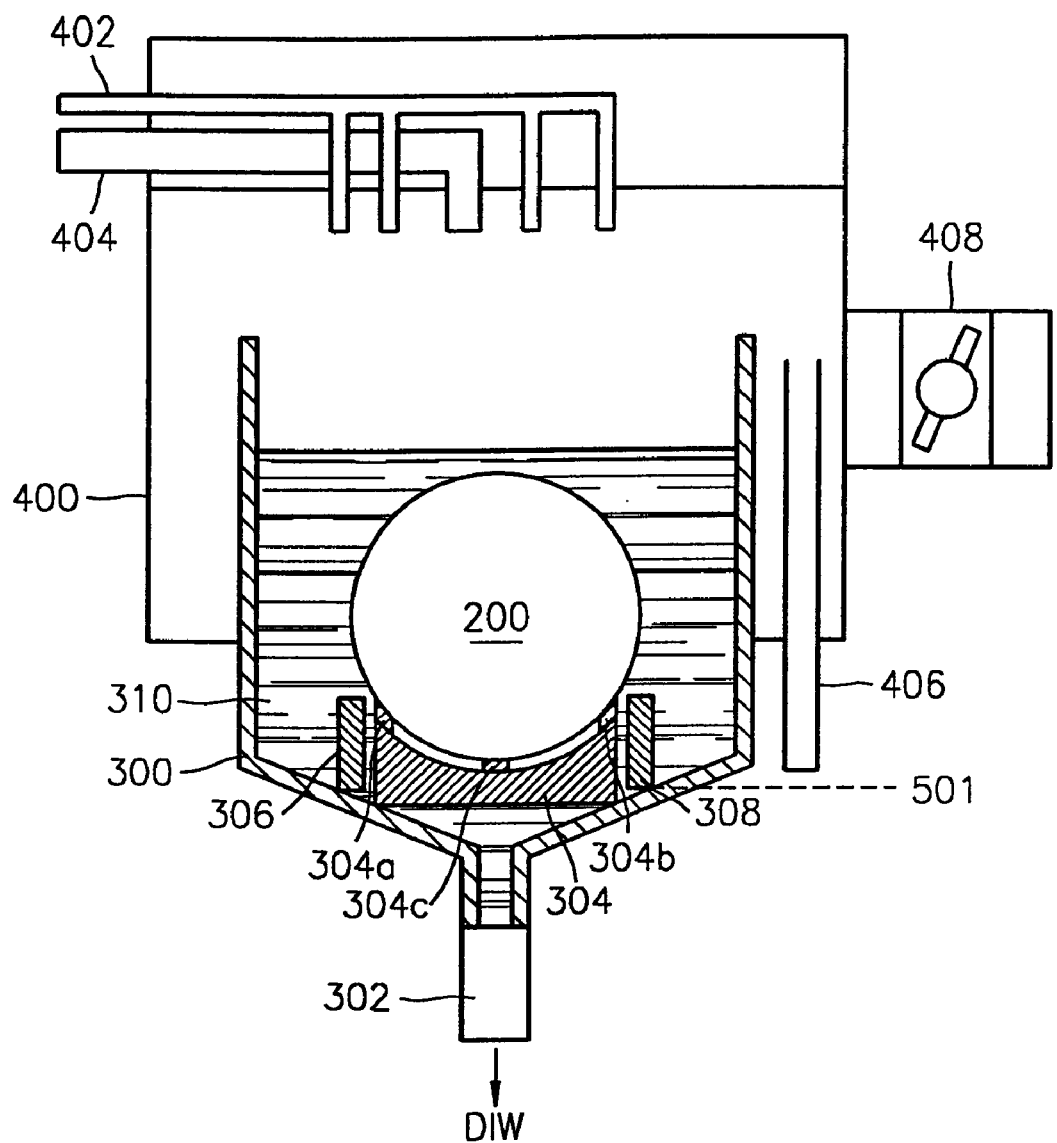
FIGS. 5A through 5F are diagrams illustrating a process of drying a semiconductor wafer using a semiconductor wafer drying apparatus according to the present invention, according to an embodiment of the present invention.

Referring to FIG. 5A, the semiconductor wafer 200 is first loaded into the bath 300 filled with the DIW 310. The semiconductor wafers 200 loaded in the bath 300 are completely dipped in the DIW 310 and a lower portion of the semiconductor wafer 200 is supported by the guides 304a, 304b, and 304c. Next, the pitch guides 306 and 308 are positioned at a first position 501. At the first position 501, the pitch guides 306 and 308 do not contact the semiconductor wafer 200.

Figure 5B:
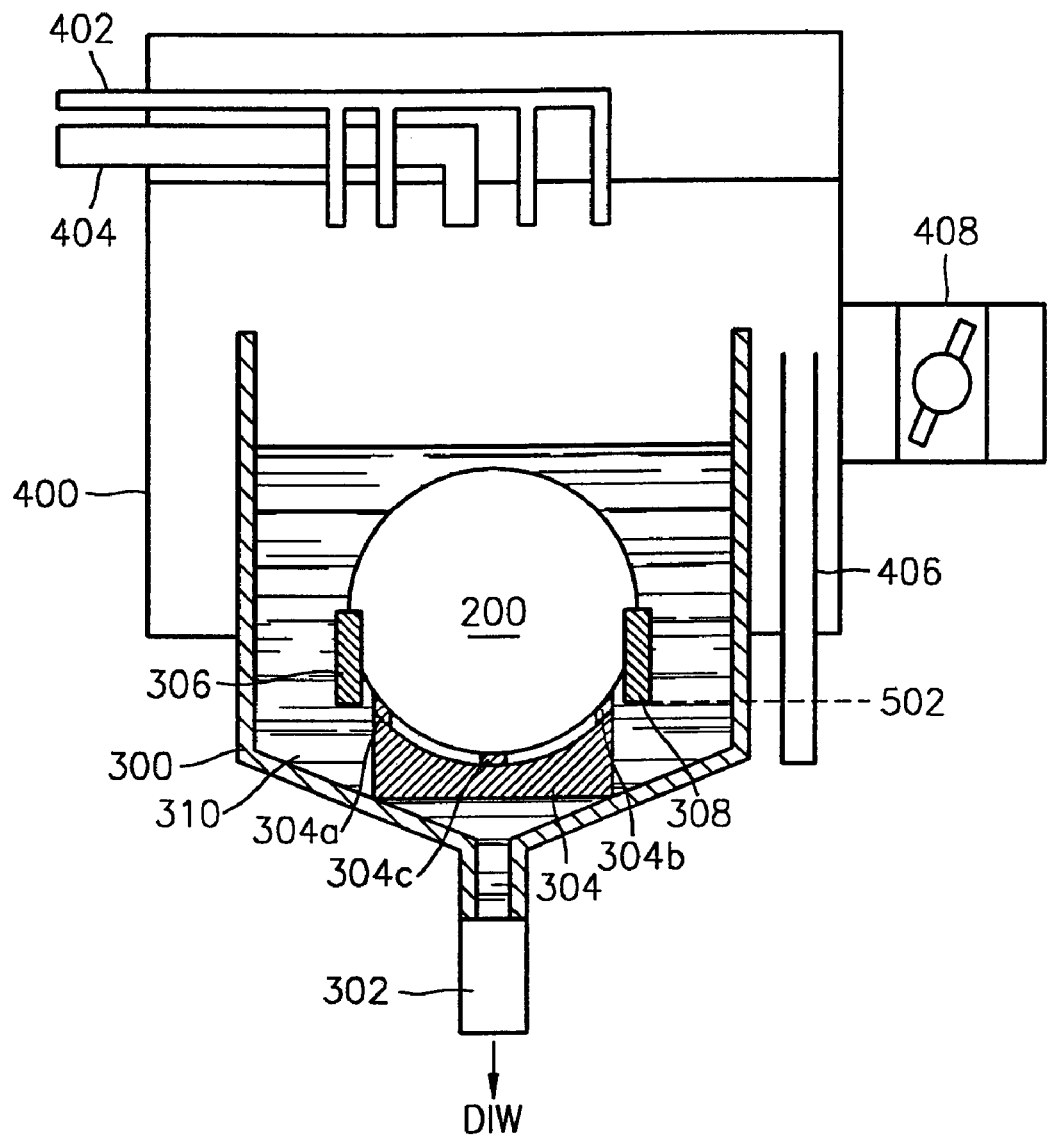

Next, referring to FIG. 5B, the pitch guides 306 and 308 are moved upward to a second position 502 so as to support the semiconductor wafer 200. At the second position 502, the pitch guides 306 and 308 support sides of the semiconductor wafer 200. As mentioned above, the pitch guides 306 and 308 are used to maintain the upper portions of adjacent semiconductor wafers 200 so that they will not to be adhered to each other.

Figure 5C:
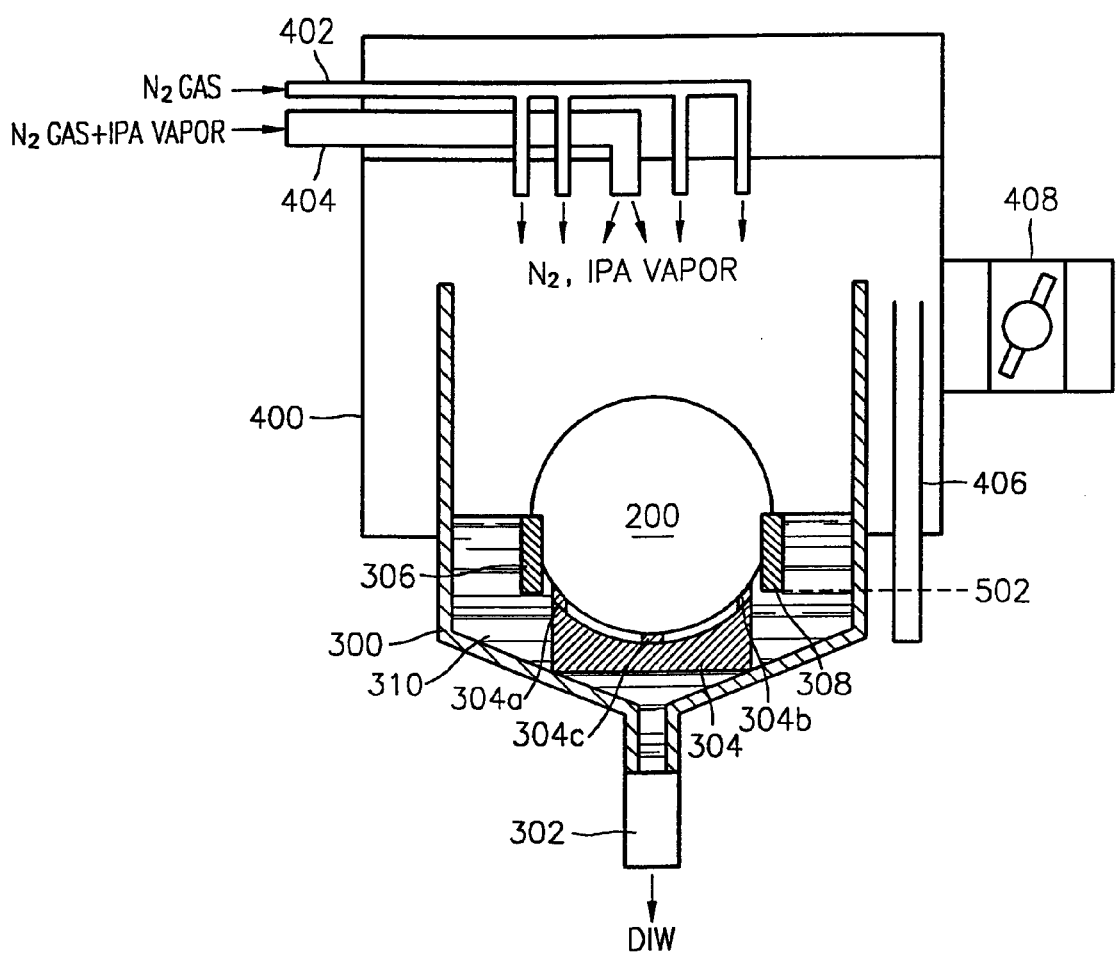

Thereafter, referring to FIG. 5C, a nitrogen gas and IPA vapor are supplied to the semiconductor wafer 200 from an upper part of the chamber 400 while the DIW 310 is gradually drained. The drained DIW 310 is discharged from the bath 300 via the DIW outlet 302. With the drainage of the DIW 310, the upper portions of the semiconductor wafer 200 are exposed and surface tension occurs with respect to the semiconductor wafer 200. The surface tension causes the semiconductor wafer 200 adhere to adjacent semiconductor wafers 200. However, since the semiconductor wafer 200 is firmly maintained in a fixed position by the pitch guides 306 and 308, the semiconductor wafer 200 does not adhere to the adjacent semiconductor wafer 200. Until the upper portion of the semiconductor wafer 200 is exposed due to the drainage of the DIW 310, the semiconductor wafer 200 is continuously held in position by the pitch guides 306 and 308.

Figure 5D:
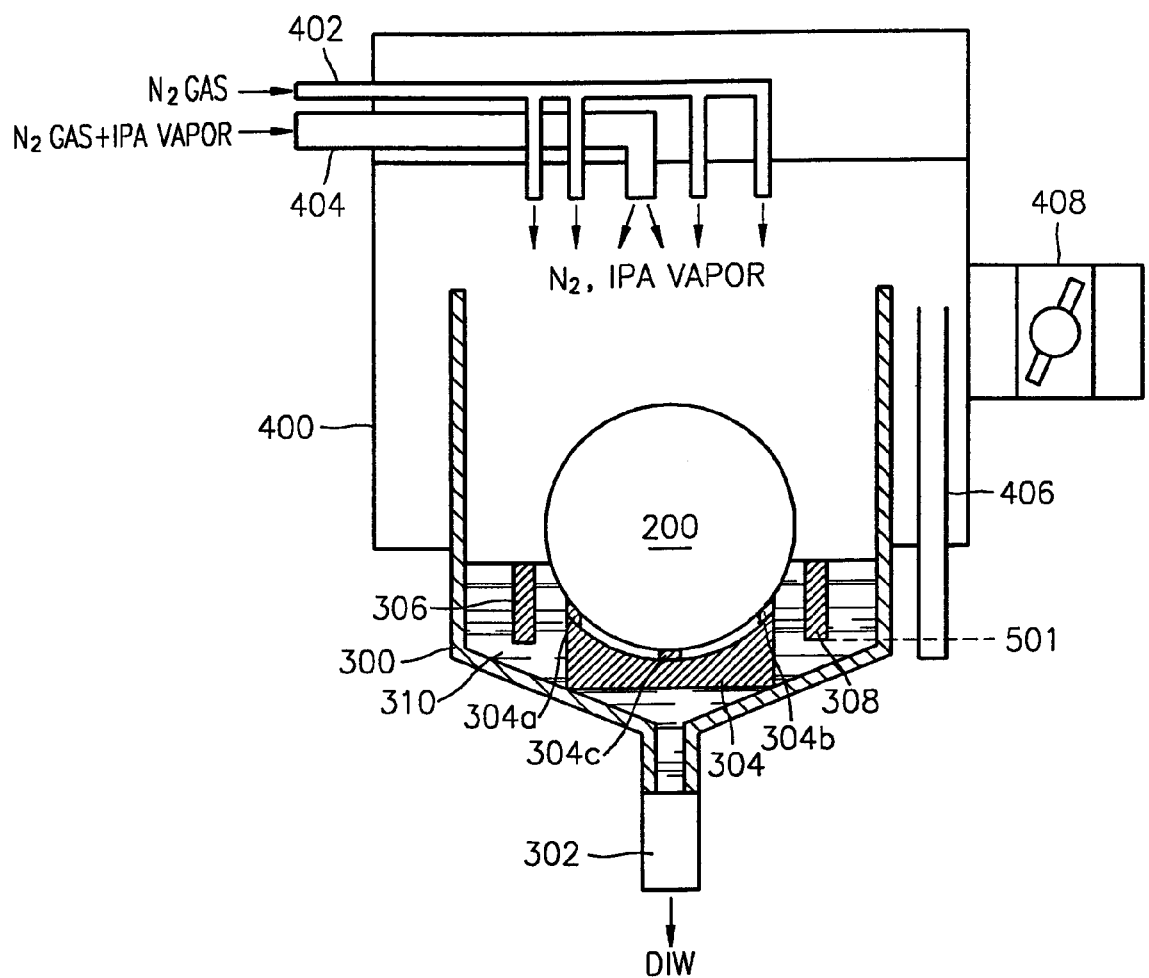

Next, referring to FIG. 5D, as the upper surfaces of the pitch guides 306 and 308 are exposed when the DIW 310 is being drained, the pitch guides 306 and 308 are gradually moved downward in complimentary manner with the lowering surface of the DIW 310. The speed of lowering the of the pitch guides 306 and 308 are set to be the same as that of draining the DIW 310, thereby exposing the tops of the pitch guides 306 and 308.

Figure 5E:
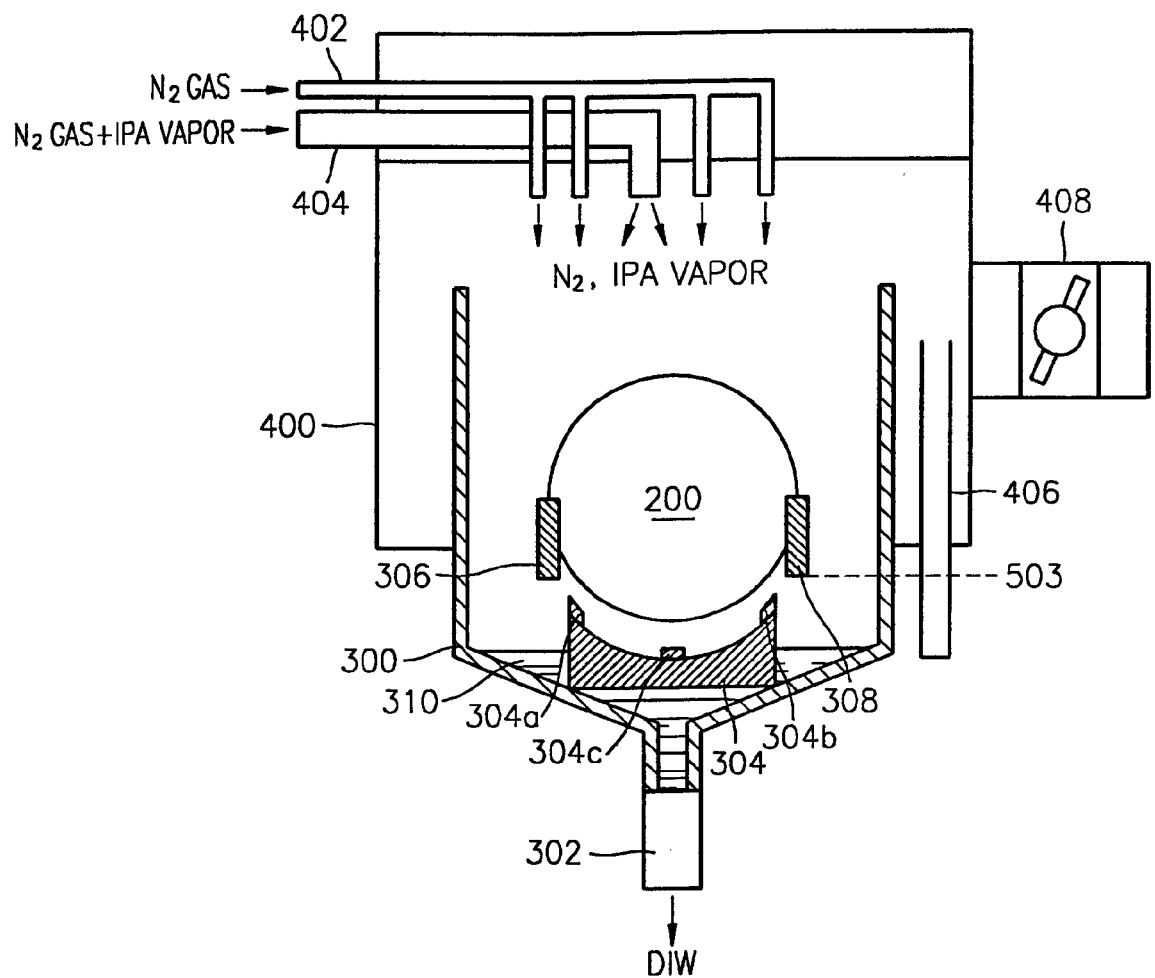

Next, referring to FIG. 5E, when the DIW 310 is almost drained and a lower portion of the semiconductor wafer 200 is exposed, the pitch guides 306 and 308 are moved upward to a third position 503 to slightly elevate the semiconductor wafer 200. Because the semiconductor wafer holder 304 is fixed, the elevation of the semiconductor wafer 200 forms a space between the lower portion of the semiconductor wafer 200 and the guides 304a through 304c of the semiconductor wafer holder 304. Through this space, the nitrogen gas and IPA vapor are supplied and thus it is possible to completely dry the lower portion of the semiconductor wafer 200, which was inserted into the guides 304a through 304c.

Figure 5F:
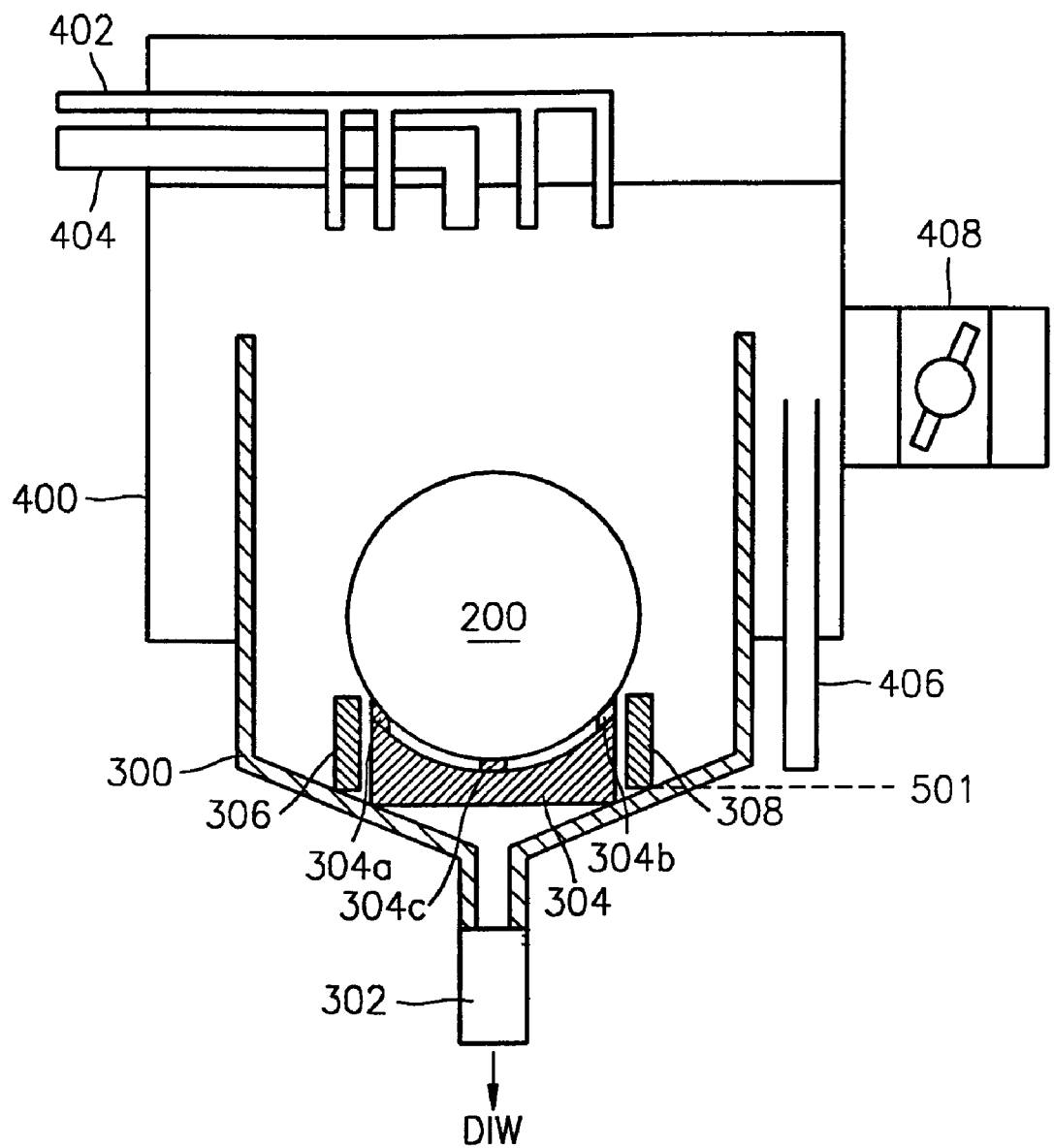

Referring to FIG. 5F, after the drainage of the DIW 310 and the drying of the lower portion of the semiconductor wafer 200, the supply of the nitrogen gas and IPA vapor is discontinued, and the pitch guides 306 and 308 are moved downward to lower the semiconductor wafer 200 to be placed on the semiconductor wafer holder 304. Next, the guides 306 and 308 are positioned at the original position, i.e., the first position 501. Lastly, the dried semiconductor wafer 200 is unloaded from the bath 300.

Figure 6A:
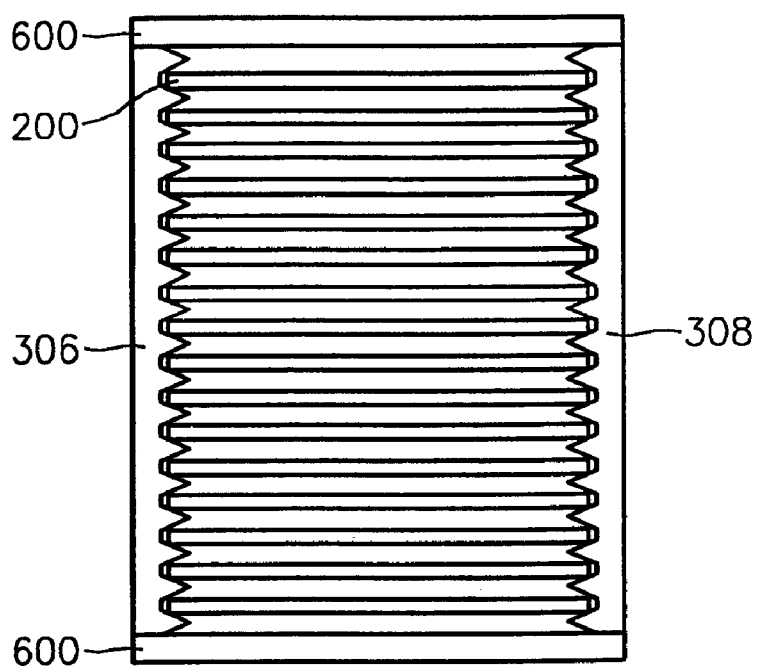
FIGS. 6A through 6C are diagrams illustrating principles of operating the first and second pitch guides shown in FIGS. 5A through 5F, according to an embodiment of the present invention.
Figure 6B:
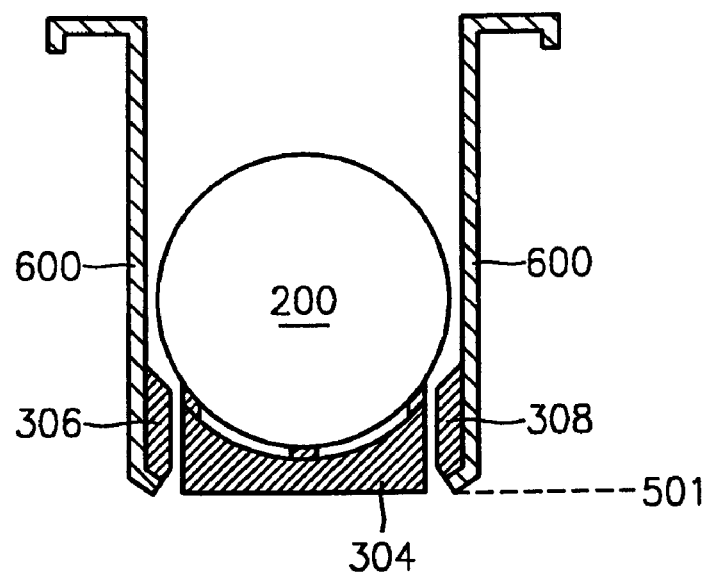
Figure 6C:
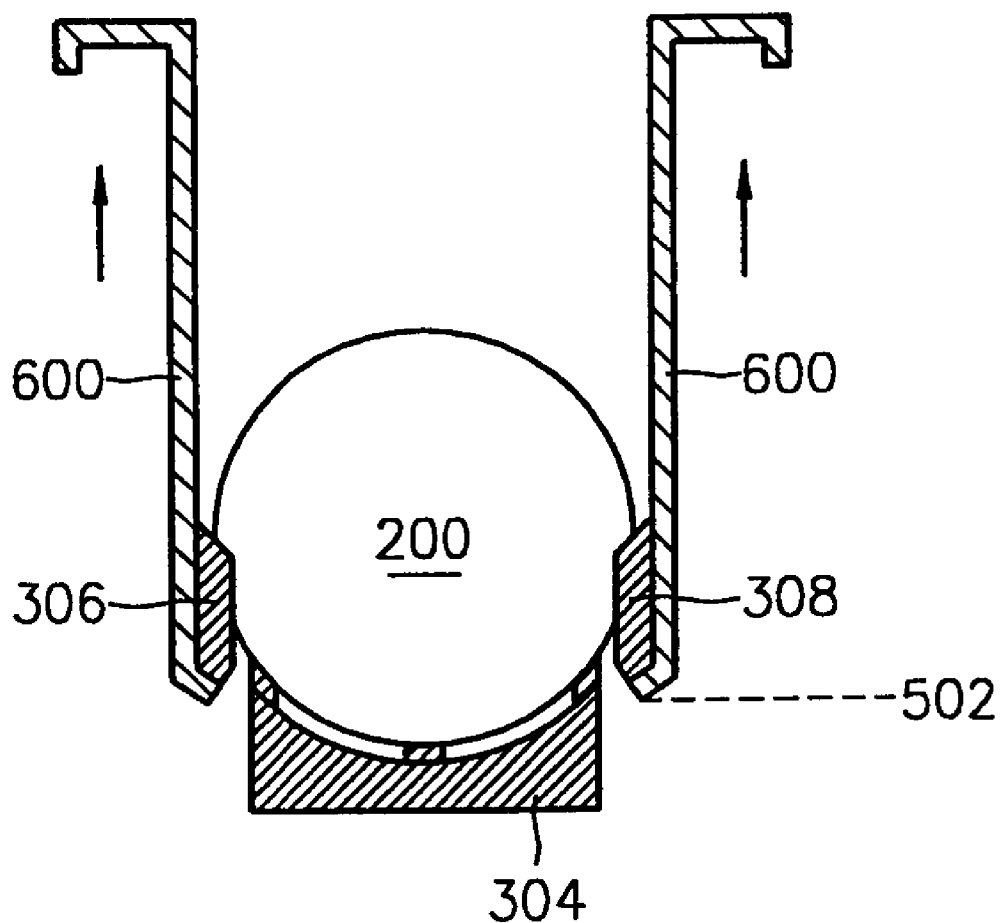

FIGS. 6A through 6C are diagrams illustrating the operation of the pitch guides 306 and 308 shown in FIGS. 5A through 5F, according to an embodiment of the present invention.

Referring to FIG. 6A, both ends of the pitch guides 306 and 308 are joined to upper and lower moving holders 600 (hereinafter "moving holder 600"), respectively. In detail, the upper ends of the pitch guides 306 and 308 are bonded with one end of a moving holder 600, and the lower ends thereof are joined with one end of another moving holder 600. Although not shown in the drawings, the moving holders 600 are connected to a piston or motor for providing a driving force to power same. Otherwise, the pitch guides 306 and 308 can be moved upward using the lifting power of the DIW 310. For more precise positioning of the pitch guides 306 and 308, they may be connected to a conventional controller that is capable of digitally controlling moving of the pitch guides 306 and 308.

As shown in FIG. 6B, the pitch guides 306 and 308 are moved to the first position 501 using the moving holder 600. Thereafter, as shown in FIG. 6C, when an external driving force is applied onto the moving holder 600, the moving holder 600 elevates the pitch guides 306 and 308 to the second position 502 in the direction of arrows C. Although not shown in the drawings, the pitch guides 306 and 308 can be moved to a desired position including the third position 503 of FIG. 5E in a similar manner as described above.

FIGS. 7A through 7D are diagrams illustrating another method of drying a semiconductor wafer 200 using a semiconductor wafer drying apparatus according to the present invention.

Figure 7A:
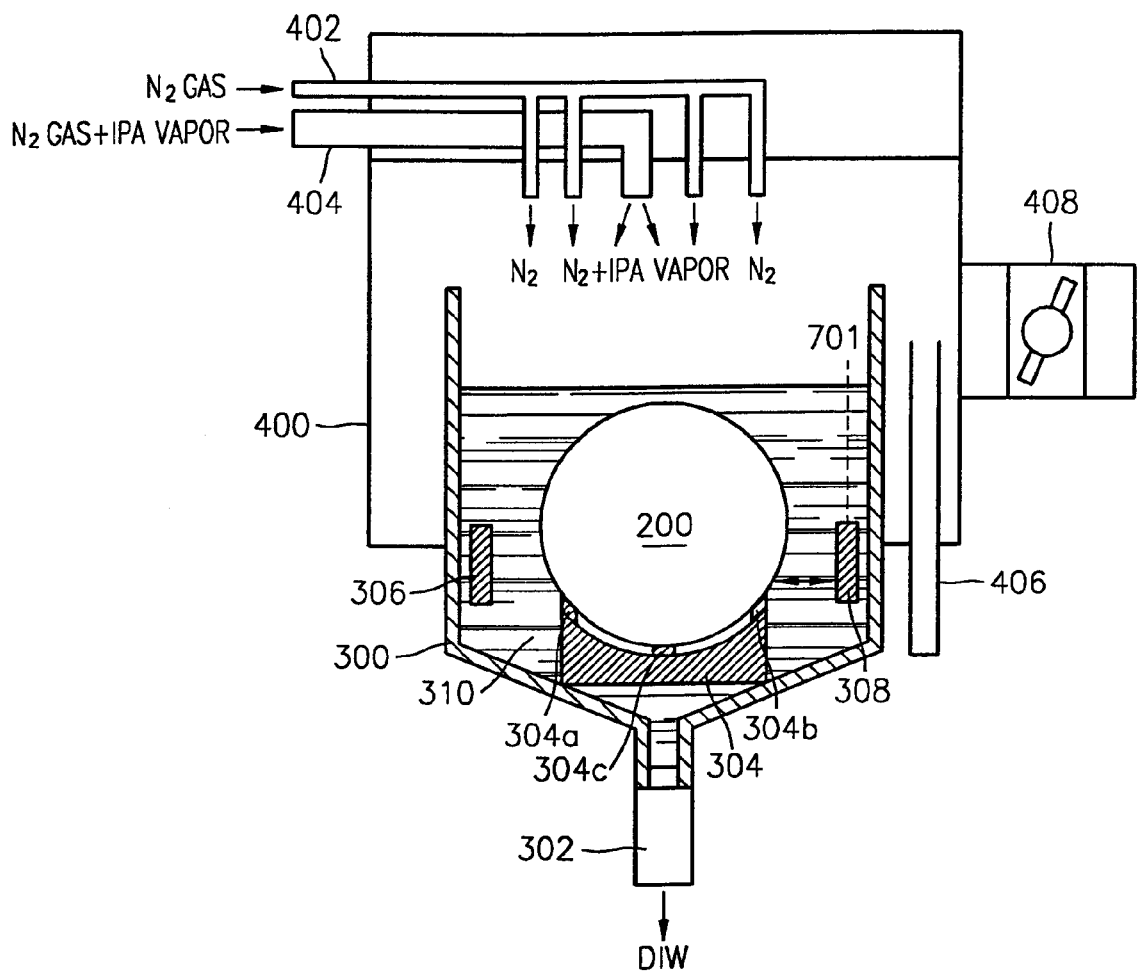
FIGS. 7A through 7D are diagrams illustrating a method of drying a semiconductor wafer using a semiconductor wafer drying apparatus according to the present invention, according to another embodiment of the present invention.

Referring to FIG. 7A, the semiconductor wafer 200 is loaded into a bath 300 filled with the DIW 310. The semiconductor wafer 200 loaded in the bath 300 is dipped in the DIW 310 and a lower portion of the semiconductor wafer 200 is supported by guides 304a, 304b, and 304c. At this time, the guides 304a through 304c are located at a first position 701. At the first position 701, the pitch guides 306 and 308 do not contact the semiconductor wafer 200, and are placed at a distance from sides of the semiconductor wafer 200.

Figure 7B:
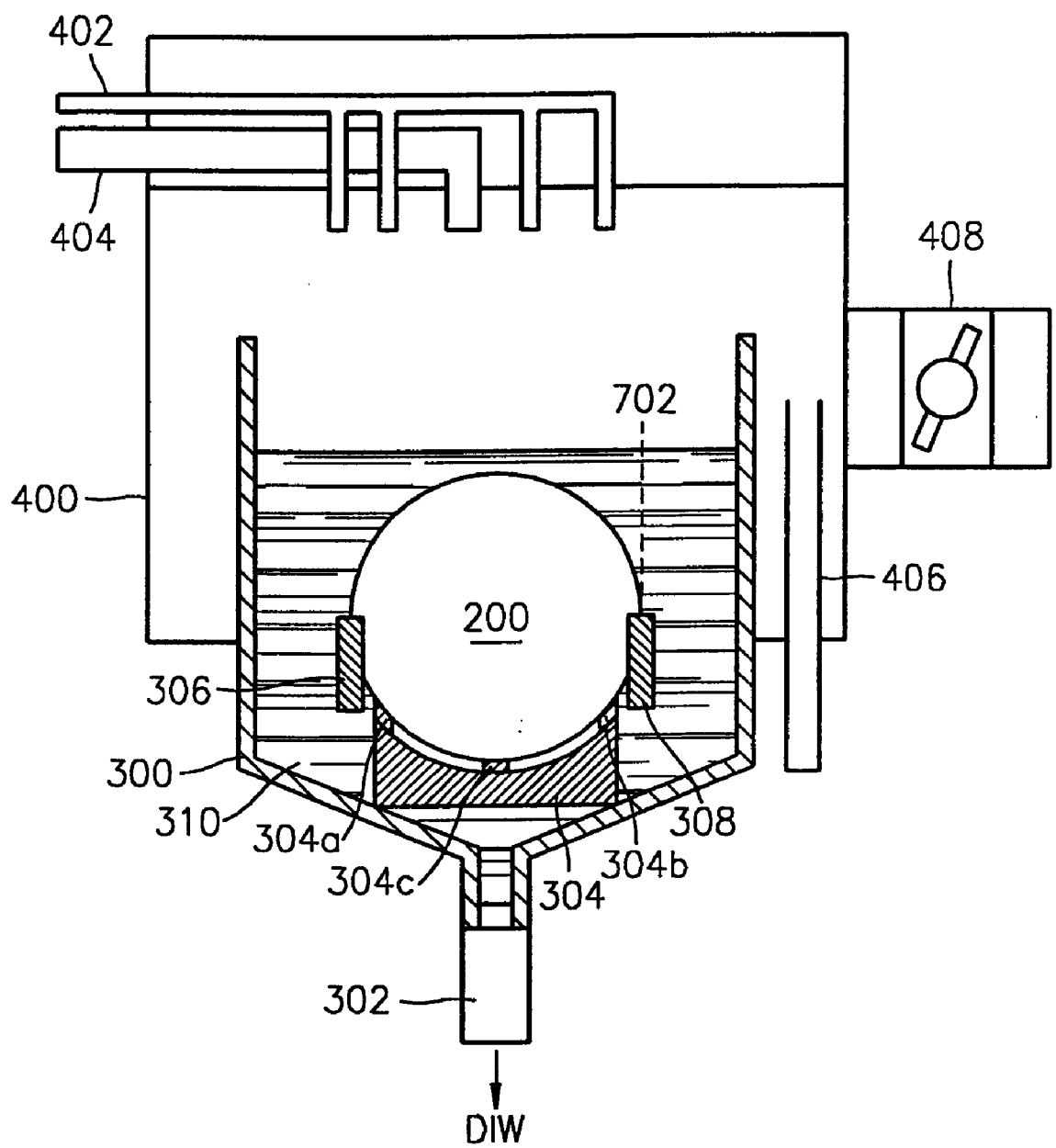

Next, referring to FIG. 7B, the pitch guides 306 and 308 are moved to a second position 702 in the horizontal direction so as to engage the sides of the semiconductor wafer 200. As mentioned above, the pitch guides 306 and 308 are used to fix the semiconductor wafer 200 such that the semiconductor wafer 200 does not sway in any directions, and in particular, so that an upper portion of the semiconductor wafer 200 is not adhered to an upper portion of an adjacent semiconductor wafer 200.

Figure 7C:
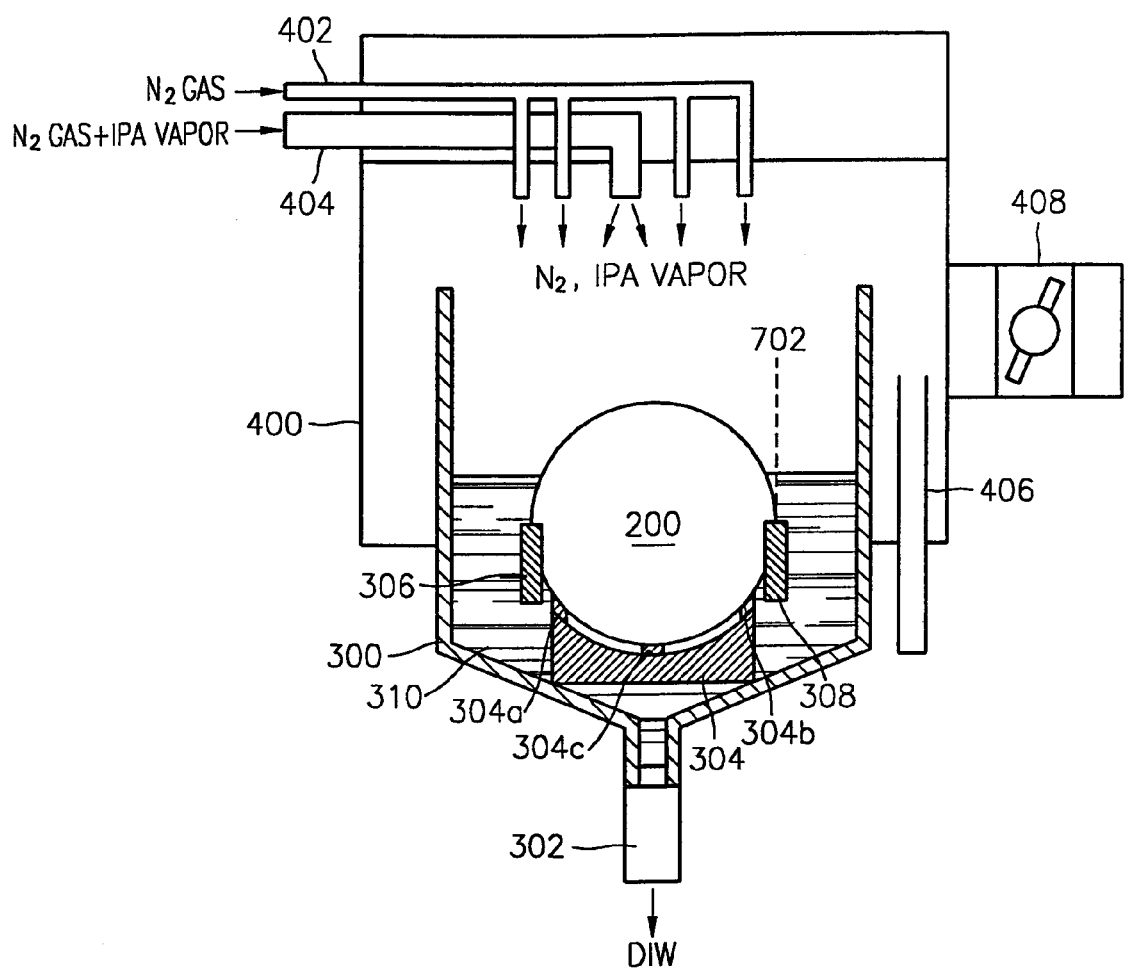

Next, referring to FIG. 7C, the nitrogen gas and IPA vapor are supplied from an upper part of a chamber 400 while the DIW 310 is being gradually drained. The DIW 310 is discharged via a DIW outlet 302. The drainage of the DIW 310 exposes the upper portion of the semiconductor wafer 200. Then, surface tension arises with respect to the exposed upper portion of the semiconductor wafer 200 and acts as a force to make the semiconductor wafer 200 cling to an adjacent semiconductor wafer 200. However, since the semiconductor wafer 200 is fixed in position by the pitch guides 306 and 308, adjacent semiconductor wafers 200 do not adhere to each other. The pitch guides 306 and 308 hold the semiconductor wafer 200 at the second position 702 until upper parts of the pitch guides 306 and 308 are exposed at the surface of the DIW 310 that is being drained.

Figure 7D:
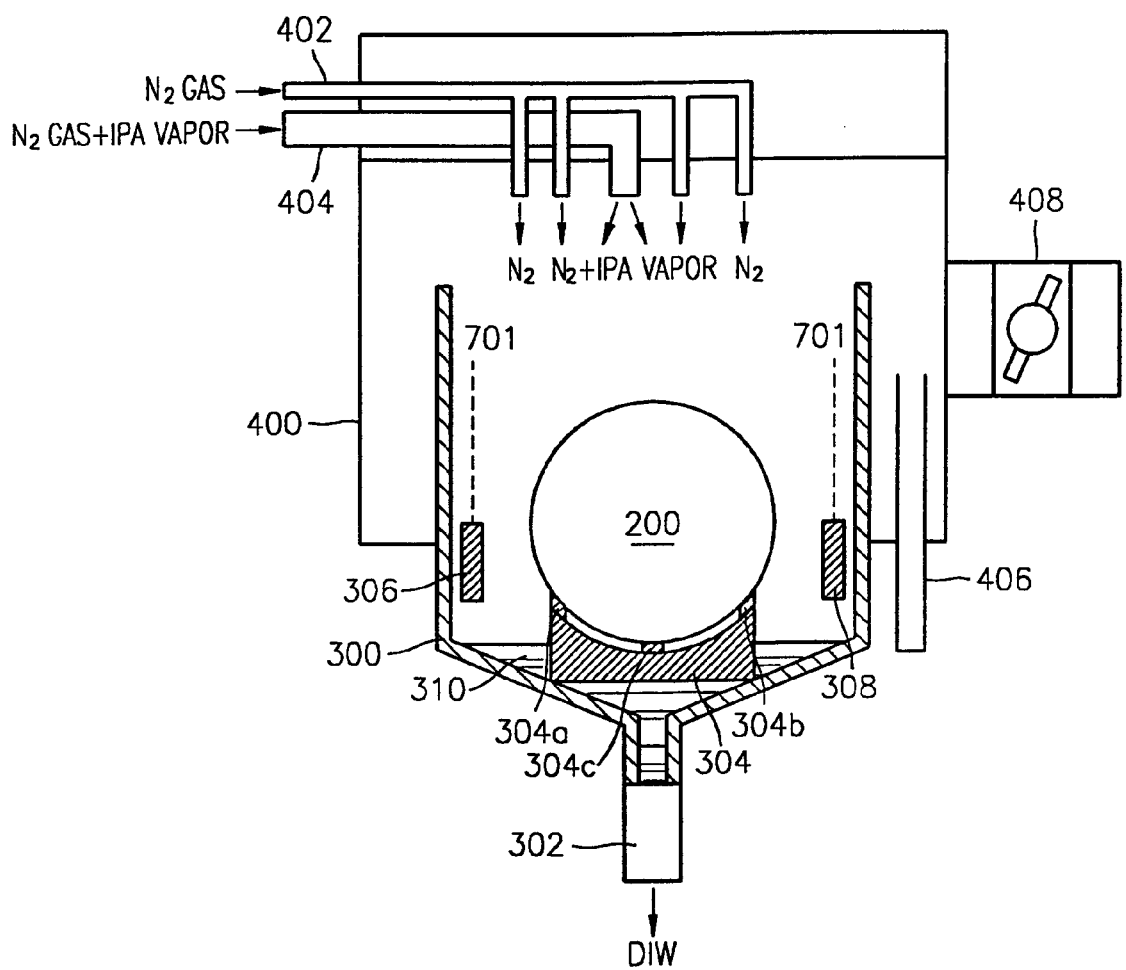

Next, referring to FIG. 7D, if the DIW 310 is drained to completely expose a lower part of the semiconductor wafer 200, the guides 306 and 308 are returned to their original position, i.e., the first position 701. Then, the supply of the nitrogen gas and IPA vapor is discontinued, and the dried semiconductor wafer 200 is unloaded out of the bath 300.

FIGS. 8A through 8D are diagrams illustrating principles of operating the pitch guides 306 and 308 shown in FIGS. 7A through 7D, according to an embodiment of the present invention.

Figure 8A:
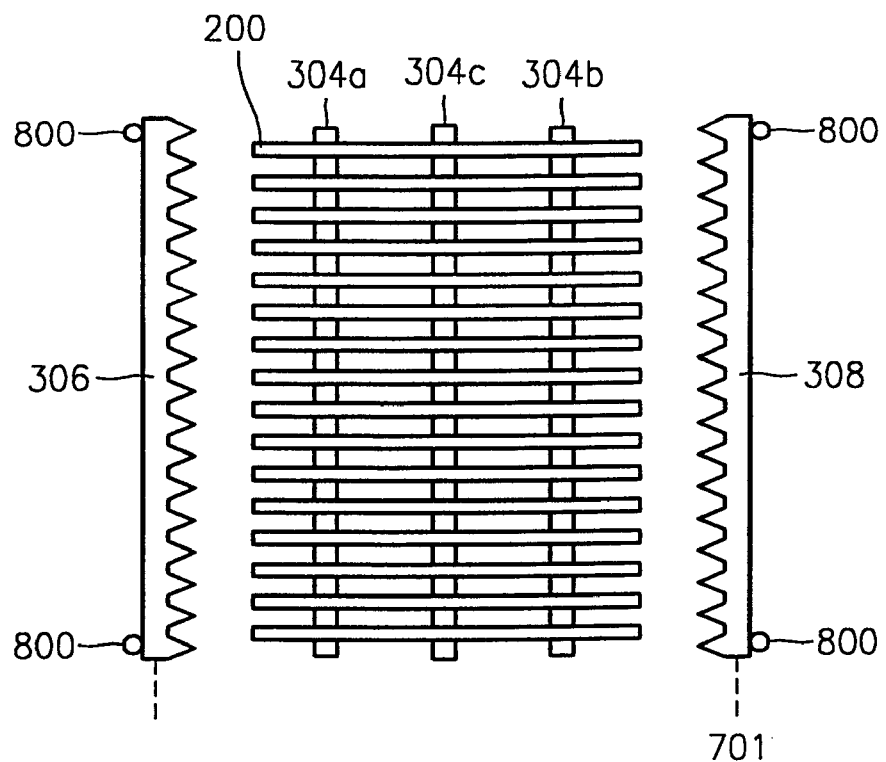
FIGS. 8A through 8D are diagrams illustrating principles of operating first and second pitch guides shown in FIGS. 7A through 7D, according to an embodiment of the present invention.
Figure 8B:
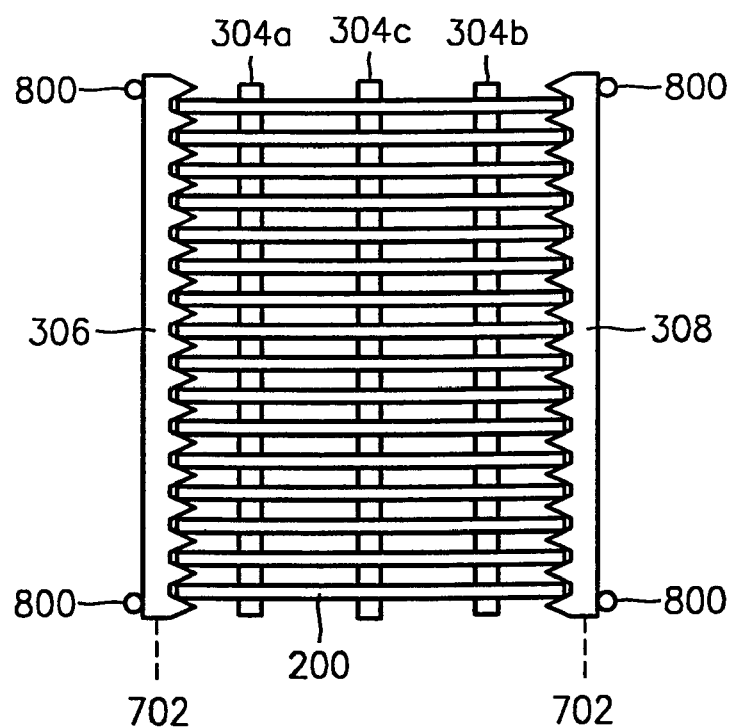

First, referring to FIGS. 8A and 8B, horizontal moving holders 800 are attached to the pitch guides 306 and 308. The horizontal moving holders 800 are movable from the first position 701 to the second position 702, or in the opposite direction, i.e., in the horizontal direction, within the bath 300. The horizontal movement of the moving holder 800 results in the horizontal movement of the pitch guides 306 and 308 from the first position 701 to the second position 702 or in the opposite direction.

Figure 8C:
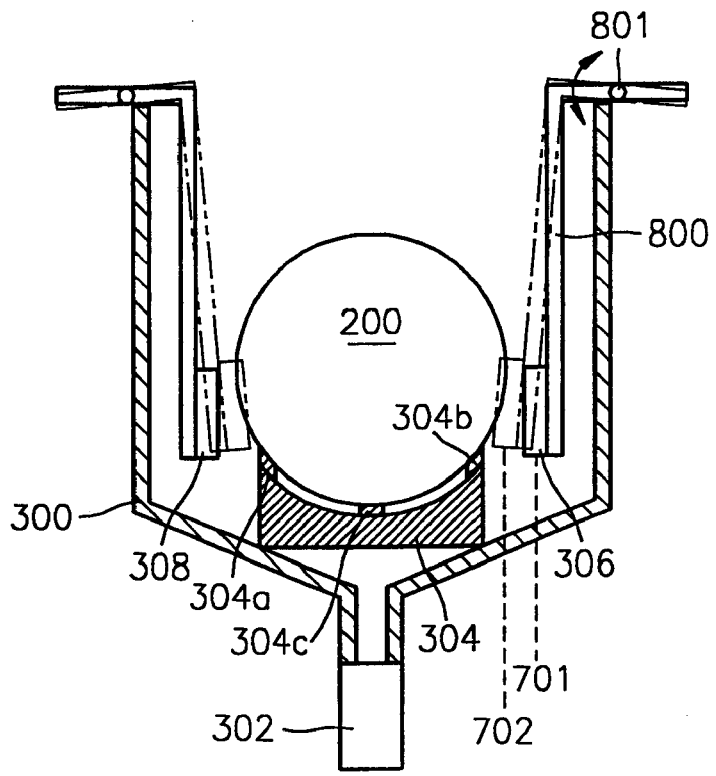

For this movement, as shown in FIG. 8C, the horizontal moving holders 800 may include lever structures. That is, the horizontal moving holders 800 are moved outside the bath 300 in the vertical direction, as indicated by the directional arrow, but are moved in the bath 300 in the horizontal direction by hinges 801. For the vertical movement of the horizontal moving holders 800 outside the bath 300, an external driving power source (not shown) may be provided via a motor or piston.

Figure 8D:
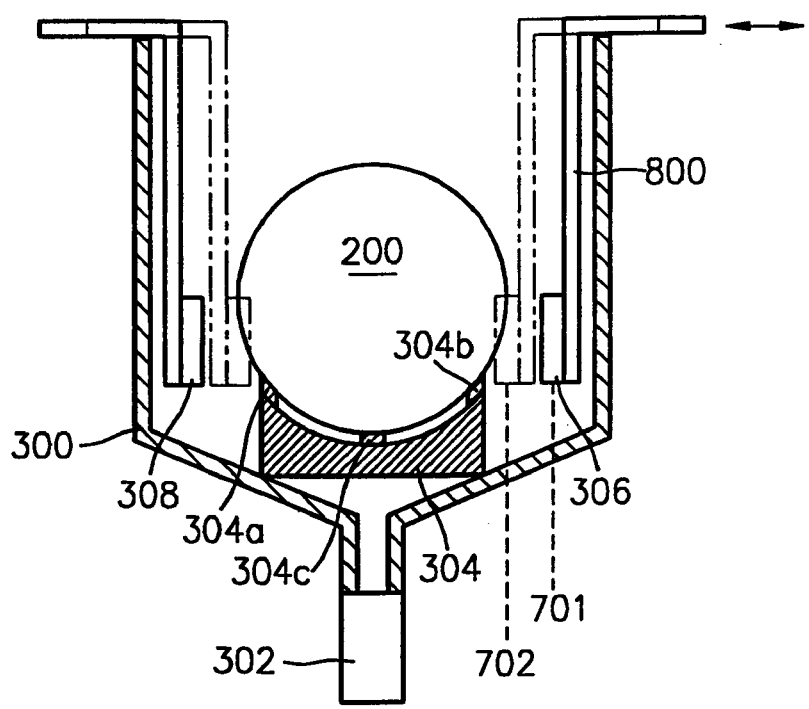

Alternatively, as shown in FIG. 8D, the horizontal moving holders 800 may be set to to be moved in the horizontal direction outside the bath 300, as well as in the bath 300, as indicated by the directional arrow. In this case, an external driving force for the horizontal movement of the horizontal moving holders 800 may be provided via a motor or piston.

While this invention has been particularly shown and described with reference to preferred embodiments thereof, it will be understood by those skilled in the art that various changes in form and details may be made therein without departing from the spirit and scope of the invention as defined by the appended claims.

As described above, a semiconductor wafer drying apparatus adopting a vapor dry method, according to an embodiment of the present invention, a drying process of drying a semiconductor wafer is performed using a half pitching method. This apparatus includes pitch guides and thus a semiconductor wafer to be dried does not sway and adjacent semiconductor wafers do not adhere to each other even if a distance between adjacent semiconductor wafers is narrower, thereby preventing the generation of foreign substances such as watermarks on the semiconductor wafer. Further, it is possible to perform the drying process on a plurality of semiconductor wafers at once.

What is claimed is:

1. An apparatus for drying semiconductor wafers, comprising:
    a lower receptacle portion defining a first compartment to retain a liquid for cleansing said semiconductor wafers;
    an upper chamber portion joined to said lower receptacle portion, said upper chamber portion defining a second compartment, said first compartment and second compartment together defining a workspace for drying semiconductor wafers;
    a vapor supply for furnishing vapor to the workspace for cleansing said semiconductor wafers;
    an exhaust exit for discharging vapor from the work space;
    a cleansing liquid exhaust exit for discharging deionized water from the workspace;
    a device for supporting the semiconductor wafer in the first compartment; and
    pitch guides located within said workspace, adjacent to the semiconductor wafer, movable to a first position and a second position in a vertical direction, wherein the pitch guides are separated from the semiconductor wafer at the first position and contact the semiconductor wafer at the second position thus preventing the movement of the semiconductor wafer.

2. The apparatus of claim 1, wherein the pitch guides can be moved to a third position wherein the semiconductor wafer is positioned at a distance from the semiconductor wafer holder.

3. The apparatus of claim 1, wherein the pitch guides are connected to a motor which provides a driving force for the vertical movement of the pitch guides.

4. The apparatus of claim 1, wherein the pitch guides are connected to a piston which provides a driving force for the vertical movement of the pitch guides.

5. The apparatus of claim 1, wherein the driving force for the vertical movements of the pitch guides is the buoyant action of the deionized water with respect to the pitch guides.

6. The apparatus of claim 1, wherein nitrogen gas and isopropyl alcohol (IPA) vapor are supplied into the chamber via vapor supply lines.

7. The apparatus of claim 1, wherein the pitch guides are moved to the second position when an upper portion of the semiconductor wafer is exposed from the surface of the deionized water.

8. A semiconductor wafer drying apparatus comprising: a receptacle containing a cleansing liquid in an amount which will permit semiconductor wafers to a soaking treatment in the cleansing liquid;

a chamber above said receptacle defining a compartment for introducing a vapor stream for drying said semiconductor wafers after said soaking treatment is completed;

a vapor supply for discharging vapor into the chamber for cleansing said semiconductor wafers;

a device for supporting the semiconductor wafer in the receptacle; and pitch guides located within said apparatus, adjacent to the semiconductor wafer, movable to a first position and a second position in a vertical direction, wherein the pitch guides are separated from the semiconductor wafer at the first position and contact the semiconductor wafer at the second position thus preventing the movement of the semiconductor wafer.

9. The apparatus of claim 8, wherein the pitch guides are connected to a motor which provides a driving force for the vertical movement of the pitch guides.

10. The apparatus of claim 8, wherein the pitch guides are connected to a piston which provides a driving force for the vertical movement of the pitch guides.

11. The apparatus of claim 8, wherein a nitrogen gas and isopropyl alcohol (IPA) vapor are supplied into the chamber via vapor supply lines.

12. The apparatus of claim 8, wherein the pitch guides are moved to the second position when an upper portion of the semiconductor wafer is exposed from the surface of the deionized water.

13. A method for drying semiconductor wafers comprising: providing a receptacle containing a cleansing liquid in an amount which will permit semiconductor wafers to a soaking treatment in the cleansing liquid;

providing a chamber above said receptacle defining a compartment for introducing a vapor stream for drying said semiconductor wafers after said soaking treatment is completed;

treating said semiconductor wafers by soaking same in the cleansing liquid;

supplying a cleansing vapor into the chamber;

supporting the semiconductor wafer in the receptacle; and providing pitch guides located within said apparatus, adjacent to the semiconductor wafer, movable to a first position and a second position in a vertical direction, wherein the pitch guides are separated from the semiconductor wafer at the first position and contact the semiconductor wafer at the second position; and preventing the movement of the semiconductor wafer employing said pitch guides.

14. The method of claim 13, wherein the pitch guides can be moved to a third position wherein the semiconductor wafer is positioned at a distance from the semiconductor wafer holder.

15. The method of claim 13, wherein the pitch guides are connected to a motor which provides a driving force for the vertical movement of the pitch guides.

16. The method of claim 13, wherein the pitch guides are connected to a piston which provides a driving force for the vertical movement of the pitch guides.

17. The method of claim 13, wherein the driving force for the vertical movement of the pitch guides is the buoyant action of the deionized water with respect to the pitch guides.

18. The method of claim 13, wherein a nitrogen gas and isopropyl alcohol (IPA) vapor are supplied into the chamber via vapor supply lines.

19. The method of claim 13, wherein the pitch guides are moved to the second position when an upper portion of the semiconductor wafer is exposed from the surface of the deionized water.

* * * * *